US011640918B2

(12) United States Patent
Takeda

(10) Patent No.: US 11,640,918 B2
(45) Date of Patent: May 2, 2023

(54) STAGE DEVICE, POWER SUPPLY MECHANISM, AND PROCESSING APPARATUS

(71) Applicant: TOKYO ELECTRON LIMITED, Tokyo (JP)

(72) Inventor: Satoshi Takeda, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/172,641

(22) Filed: Feb. 10, 2021

(65) Prior Publication Data
US 2021/0249295 A1 Aug. 12, 2021

(30) Foreign Application Priority Data

Feb. 12, 2020 (JP) .............................. JP2020-021314

(51) Int. Cl.
*H01L 21/683* (2006.01)
*H01L 21/67* (2006.01)
*H01L 43/08* (2006.01)
*H01L 43/12* (2006.01)
*H01J 37/34* (2006.01)
*H01J 37/32* (2006.01)
*C23C 14/35* (2006.01)
*C23C 14/50* (2006.01)

(52) U.S. Cl.
CPC .......... *H01L 21/6833* (2013.01); *C23C 14/35* (2013.01); *C23C 14/50* (2013.01); *H01J 37/32724* (2013.01); *H01J 37/32834* (2013.01); *H01J 37/3426* (2013.01); *H01L 21/67103* (2013.01); *H01L 43/08* (2013.01); *H01L 43/12* (2013.01); *H01J 2237/002* (2013.01); *H01J 2237/2007* (2013.01); *H01J 2237/332* (2013.01)

(58) Field of Classification Search
None
See application file for complete search history.

(56) References Cited

U.S. PATENT DOCUMENTS 5,557,215 A * 9/1996 Saeki .................. H01L 21/6833
156/345.28
5,685,941 A * 11/1997 Forster .............. H01J 37/32091
204/298.34

(Continued)

FOREIGN PATENT DOCUMENTS

JP 2015-226010 A 12/2015

*Primary Examiner* — Jason Berman
(74) *Attorney, Agent, or Firm* — Fenwick & West LLP

(57) ABSTRACT

A stage device includes a stage having a copper main body and an electrostatic chuck, a cooling unit disposed below the stage, and a power supply mechanism for supplying power to an attraction electrode of the electrostatic chuck from a DC power supply disposed below the stage. The power supply mechanism includes a pair of terminals disposed at an outer peripheral portion of the stage while being spaced apart from each other, a first power supply line having a pair of metal rods spaced apart from each other while extending toward the stage and being connected to the DC power supply, a second power supply line having a pair of metal rods spaced apart from each other and connected to the terminals, and a connecting unit where the metal rods of the first power supply line and the metal rods of the second power supply line are connected.

19 Claims, 4 Drawing Sheets

(56) References Cited

U.S. PATENT DOCUMENTS

| | | | | |
|---|---|---|---|---|
| 8,709,953 B2* | 4/2014 | Lill | ................. | B82Y 40/00 |
| | | | | 438/715 |
| 2003/0169553 A1* | 9/2003 | Brown | ................. | H02N 13/00 |
| | | | | 361/234 |
| 2005/0039773 A1* | 2/2005 | Moriya | ............. | H01J 37/32431 |
| | | | | 134/1.2 |
| 2016/0071707 A1* | 3/2016 | Furukawa | ......... | H01J 37/32733 |
| | | | | 204/298.09 |
| 2018/0209035 A1* | 7/2018 | Liu | ................. | H01J 37/3405 |
| 2019/0295823 A1* | 9/2019 | Kofuji | ................. | H01L 21/6833 |

* cited by examiner

STAGE DEVICE, POWER SUPPLY MECHANISM, AND PROCESSING APPARATUS

CROSS-REFERENCE TO RELATED APPLICATION

This application claims priority to Japanese Patent Application No. 2020-021314, filed on Feb. 12, 2020, the entire contents of which are incorporated herein by reference.

TECHNICAL FIELD

The present disclosure relates to a stage device, a power supply mechanism, and a processing apparatus.

BACKGROUND

In a semiconductor device manufacturing process, a film forming process may be performed at an extremely low temperature. Japanese Patent Application Publication No. 2015-226010 discloses an electrostatic chuck used for attracting and holding a substrate in an extremely low temperature process.

In Japanese Patent Application Publication No. 2015-226010, a terminal is disposed at an outer peripheral portion of a stage, and electrical power is supplied from an external power supply to an attraction electrode of the electrostatic chuck through the terminal.

SUMMARY

The present disclosure provides a stage device having a cooling unit disposed below a stage and a power supply mechanism that is easily attached to an electrostatic chuck and less likely to cause an abnormal supply of power, the power supply mechanism, and a processing apparatus.

In accordance with an aspect of the present disclosure, there is provided a stage device for holding a substrate in a processing chamber maintained in a vacuum state in a processing apparatus for processing a substrate, the stage device including: a stage including a main body made of copper and an electrostatic chuck that is disposed on the main body and has therein an attraction electrode to attract and hold the substrate; a cooling unit disposed below the stage and configured to cool the stage; and a power supply mechanism configured to supply power to the attraction electrode from a DC power supply disposed below the stage. The power supply mechanism includes: a pair of terminals disposed at an outer peripheral portion of the stage while being spaced apart from each other, the pair of terminals having connecting portions respectively connected to a positive side and a negative side of the attraction electrode; a first power supply line having a pair of metal rods spaced apart from each other, the pair of metal rods extending toward the stage and having one ends respectively connected to a positive side and a negative side of the DC power supply; a second power supply line having a pair of metal rods spaced apart from each other, the pair of metal rods having one ends respectively connected to the pair of terminals; and a connecting unit where the other ends of the pair of metal rods of the first power supply line and the other ends of the pair of metal rods of the second power supply line are connected.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described in detail with reference to the accompanying drawings.

First Embodiment

Figure 1:
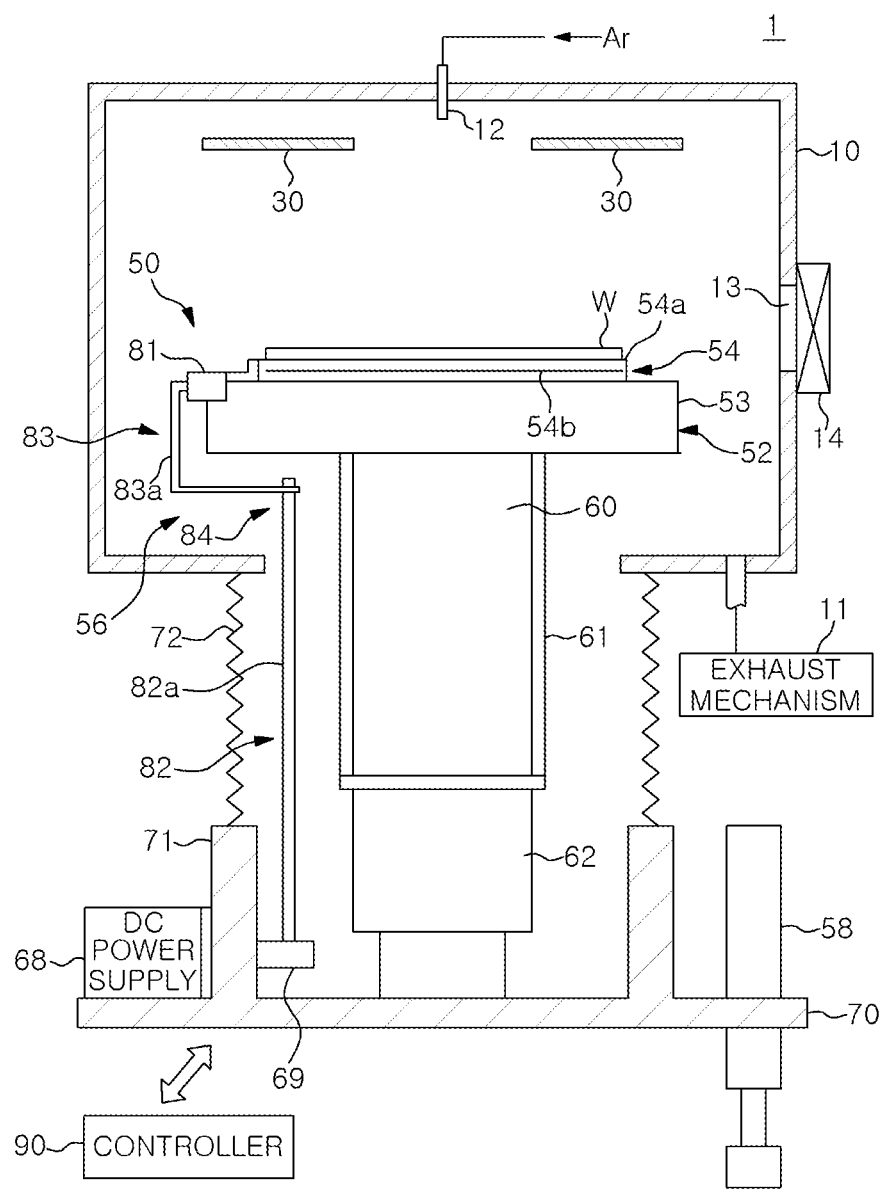
FIG. 1 is a cross-sectional view schematically showing an example of a processing apparatus including a stage device according to a first embodiment.

A first embodiment will be described.
(Processing Apparatus)
First, an example of a processing apparatus including a stage device according to the first embodiment will be described. FIG. 1 is a cross-sectional view schematically showing an example of the processing apparatus.

As shown in FIG. 1, a processing apparatus 1 includes a processing chamber 10 that can be maintained in a vacuum state, a target 30, a stage device 50, and a controller 90. The processing apparatus 1 is configured as a film forming apparatus for forming a magnetic film on a semiconductor wafer (hereinafter, simply referred to as "wafer") W that is a substrate by sputtering in an environment of ultra-high vacuum and an extremely low temperature in the processing chamber 10. The magnetic film is used for, e.g., a tunneling magneto-resistance (TMR) element.

The processing chamber 10 is a processing container configured to process the wafer W that is a substrate. The processing chamber 10 is connected to an exhaust mechanism 11 having a vacuum pump capable of reducing a pressure in the processing chamber 10 to an ultra-high vacuum level (e.g., 10' Pa or less). A gas supply line 12 is connected to the processing chamber 10 to supply a sputtering gas for sputtering film formation, for example, argon (Ar) gas. The sputtering gas may be other noble gases such as krypton (Kr) gas, neon (Ne) gas or the like, or may be a nitrogen gas. Further, a loading/unloading port 13 for the wafer W is formed on a sidewall of the processing chamber 10. The loading/unloading port 13 is opened and closed by a gate valve 14.

The target 30 is disposed at an upper portion of the processing chamber 10 to face the wafer W held on the stage device 50. An AC voltage or a DC voltage is applied to the target 30 from a plasma generation power supply (not shown). When the AC voltage or the DC voltage is applied to the target 30 from the plasma generation power supply in a state where the sputtering gas is introduced into the processing chamber 10, plasma of the sputtering gas is generated in the processing chamber 10 and the target 30 is sputtered by ions in the plasma. Atoms or molecules of the sputtered target material are deposited on the surface of the wafer W held on the stage device 50. Although the number of targets 30 is not particularly limited, it is preferable to provide a plurality of targets 30 so that films of different materials can be formed in a single processing apparatus 1. For example, when a magnetic film (film containing a ferromagnetic material such as Ni, Fe, or Co) is deposited, the target 30 may be made of, for example, CoFe, FeNi, or NiFeCo. Alternatively, the target 30 may be made of materials containing other elements in addition to those materials.

The controller 90 is configured to control the individual components of the processing apparatus 1. For example, the controller 90 controls a voltage applied to the target 30, a cooling temperature in the stage device 50 to be described later, and the raising and lowering of the stage, for example. The controller 90 is a computer and includes a main control unit having a CPU, an input device, an output device, a display device, and a storage device. The storage device is provided with a storage medium in which processing recipes are stored. The main control unit causes the processing apparatus 1 to perform a predetermined operation based on a processing recipe called from the storage medium. The controller 90 also functions as a part of the stage device 50.

(Stage Device)

Figure 2:
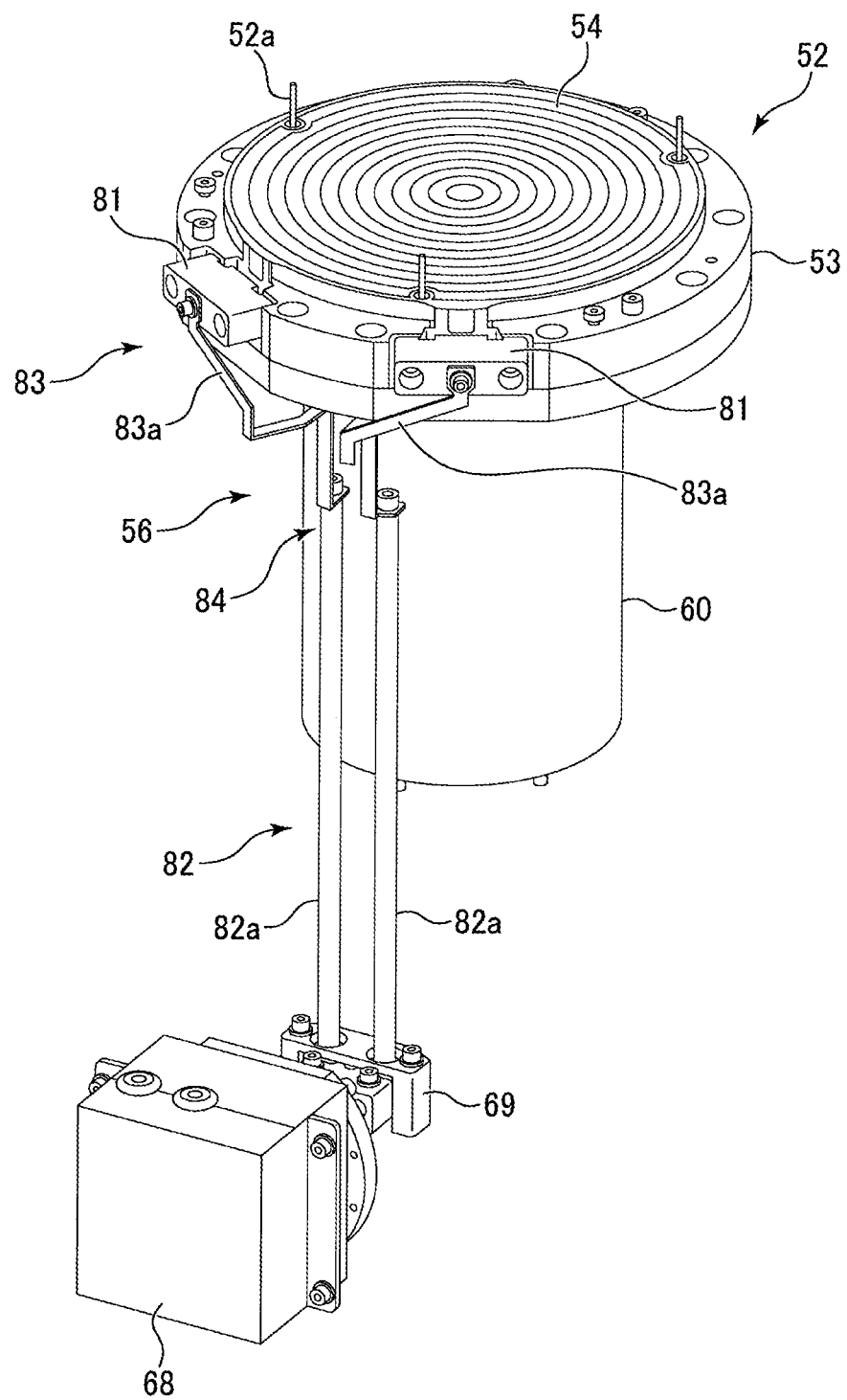
FIG. 2 is a perspective view showing main parts of the stage device according to the first embodiment.

Next, the stage device 50 according to the first embodiment will be described in detail with reference to FIGS. 1 and 2. FIG. 2 is a perspective view showing main parts of the stage device of the first embodiment. The stage device 50 holds the wafer W and cools the wafer W to an extremely low temperature.

As shown in FIGS. 1 and 2, the stage device 50 includes a stage 52, a power supply mechanism 56, a stage elevating mechanism 58, a cold heat transfer body 60, and a chiller 62. The chiller 62 and the cold heat transfer body 60 constitute a cooling unit disposed below the stage 52.

The stage 52 includes a disc-shaped main body 53 made of pure copper and an electrostatic chuck 54 disposed on the main body 53. The electrostatic chuck 54 has a configuration in which an attraction electrode 54b is embedded in a disc-shaped dielectric member 54a. The wafer W is electrostatically attracted and held on the electrostatic chuck 54 by applying a DC voltage from a DC power supply 68 disposed below the processing chamber 10 to the attraction electrode 54b through the power supply mechanism 56. The stage 52 is provided with lift pins 52a (shown only in FIG. 2) that protrude beyond and retract below the surface of the electrostatic chuck 54 to raise and lower the wafer W at the time of transferring the wafer W.

The cold heat transfer body 60 has a substantially cylindrical shape and is made of pure copper. The cold heat transfer body 60 supports the center of the bottom surface of the stage 52. The cold heat transfer body 60 is disposed such that the center thereof coincides with the central axis of the stage 52 and extends downward from the stage 52 to be supported by the chiller 62. The chiller 62 cools the stage 52 to an extremely low temperature through the cold heat transfer body 60. At this time, the cooling temperature of the stage 52 is preferably −30° C. (243K) or lower, and more preferably −173° C. (100K) or lower. The chiller 62 has a cold head at an upper portion thereof, and cold heat is transferred from the cold head to the cold heat transfer body 60. In view of optimizing the cooling performance, the chiller 62 preferably uses the Gifford-McMahon (GM) cycle. In the case of forming a magnetic film used for a TMR element, the temperature for cooling the stage 52 is within a range from −123° C. to −223° C. (150 K to 50K), and more preferably within a range from −173° C. to −223° C. (100 K to 50K). The cooling temperature of the chiller 62 is controlled by the controller 90.

The cold heat transferred from the chiller 62 to the cold heat transfer body 60 is transferred to the stage 52, and the wafer W on the stage 52 is cooled through the stage 52.

A heat insulating structure 61 is disposed at an outer periphery of the cold heat transfer body 60. The heat insulating structure 61 has, for example, a vacuum insulated structure (double-walled vacuum pipe structure) inside of which is maintained in a vacuum state. With the heat insulating structure 61, it is possible to suppress deterioration of the cooling performance of the cold heat transfer body 60.

The stage elevating mechanism 58 is configured to raise and lower an elevating plate 70. The elevating plate 70 supports the chiller 62, and the elevating plate 70 is raised and lowered by the stage elevating mechanism 58 to raise and lower the stage 52 via the chiller 62 and the cold heat transfer body 60. The stage elevating mechanism 58 is configured to move the stage 52 between a transfer position where the wafer W is placed on the stage 52 and a processing position where film formation is performed on the wafer W placed on the stage 52. The transfer position is set to be lower than the processing position. Further, the distance between the target 30 and the wafer W can be controlled by the stage elevating mechanism 58.

A cylindrical protruding portion 71 protruding upward is formed at the center of the elevating plate 70. A bellows 72 having a metal bellows structure that can be expanded and contracted in a vertical direction is disposed between the protruding portion 71 and the bottom surface of the processing chamber 10. The bellows 72 has a function of separating the vacuum space communicating with the processing chamber 10 from the space of an atmospheric atmosphere, so that the stage 52 can be raised and lowered while maintaining the inside of the processing chamber 10 in a vacuum state.

The DC power supply 68 is disposed at an outer side of the protruding portion 71 of the elevating plate 70, and a power supply terminal 69 thereof extends toward the inner side of the protruding portion 71. A gap between the power supply terminal 69 and the protruding portion 71 is vacuum-sealed.

The power supply mechanism 56 is configured to supply power from the DC power supply 68 to the attraction electrode 54b of the electrostatic chuck 54. Further, the power supply mechanism 56 supplies the power from an outer peripheral side of the stage 52 to the attraction electrode 54b. The power supply mechanism 56 includes a pair of terminals 81, a first supply line 82, a second supply line 83, and a connecting unit 84.

The pair of terminals 81 is separated from each other to prevent discharge from occurring at the outer peripheral portion of the stage 52. The pair of terminals 81 has connecting portions respectively connected to a positive side and a negative side of the attraction electrode 54b. An outer side of each of the connecting portions is covered with an insulator.

The first power supply line 82 has a pair of metal rods 82a respectively connected to a positive side and a negative side of the DC power supply 68. The pair of metal rods 82a extends upward along the side surface of the cooling unit (the chiller 62 and the cold heat transfer body 60) to reach the connecting unit 84. The pair of metal rods 82a are separated from each other to prevent discharge. Lower ends of the pair of metal rods 82a of the first power supply line 82 are respectively connected to a positive side and a negative side of the power supply terminal 69.

The second power supply line 83 has a pair of metal rods 83a having one ends respectively connected to the pair of terminals 81 and the other ends respectively connected to upper ends of the metal rods 82a of the first power supply line 82 at the connecting unit 84. The connecting unit 84 is disposed directly below the stage 52, and the metal rods 82a of the first supply line 82 and the metal rods 83a of the second supply line 83 are screw-fixed to the connecting unit 84, for example. Since the gap between the pair of terminals 81 is greater than that between the pair of metal rods 83a of the first power supply line 82, the pair of metal rods 83a extend toward the connecting unit 84 to be close to each other.

The metal rods 82a of the first power supply line 82 and the metal rods 83a and the second power supply line 83 are preferably made of stainless steel. If the metal rods 82a and 83a are made of copper having high electrical conductivity, dew condensation occurs when the stage is cooled to an extremely low temperature due to high thermal conductivity of the metal rods 82a and 83a.

(Operation of Processing Apparatus and Stage Device)

In the processing apparatus 1, the processing chamber 10 is evacuated, and the chiller 62 of the stage device 50 is operated. Accordingly, the stage 52 is maintained at an extremely low temperature of, e.g., −30° C. (243K) or lower, and preferably −173° C. (100K) or lower, due to the cold heat transferred from the chiller 62 maintained at an extremely low temperature to the cold heat transfer body 60. Further, the inside of the processing chamber 10 is maintained at an ultra-high vacuum level of, e.g., $1\times10^{-5}$ Pa or less, and preferably $1\times10^{-7}$ Pa or less.

Then, the stage 52 is moved (lowered) to the transfer position by the stage elevating mechanism 58, and the wafer W is transferred from a vacuum transfer chamber (not shown) into the processing chamber 10 and placed on the stage 52 by a transfer device (not shown). Next, a DC voltage is applied from the DC power supply 68 to the attraction electrode 54b through the power supply mechanism 56, and the wafer W is electrostatically attracted and held on the electrostatic chuck 54.

Then, the stage 52 is raised to the processing position. A sputtering gas such as Ar gas is supplied from the gas supply line 12 into the processing chamber 10 at a flow rate of, for example, 500 sccm or less, and a voltage is applied to the target 30 to perform sputtering film formation.

In a general processing apparatus, a cylindrical support column extends downward from the center of the bottom surface of the stage, and a power supply line is provided in the support column and connected to the central portion of the attraction electrode. However, in the present embodiment, since the center of the bottom surface of the stage 52 is supported by the cold heat transfer body 60, it is difficult to employ such a power supply method. Therefore, in the present embodiment, power is supplied to the attraction electrode 54b from the outer peripheral side of the stage 52.

In the high vacuum processing of the present embodiment, generally, discharge is unlikely to occur when there is a sufficient insulation distance between a pair of power supply lines, even if the pair of power supply lines is exposed. In fact, in order to maintain the high vacuum state, it is advantageous not to provide a cover (insulation coating) for each power supply line, which may serve as a gas release source.

In another case, the pair of power supply lines may be formed of general flexible lines. However, they are likely to become close to each other or brought into contact with each other due to deformation, and discharge is likely to occur. Therefore, attraction failure of the electrostatic chuck may occur due to an abnormal supply of power.

Therefore, in the present embodiment, the first power supply line 82 has the pair of metal rods 82a and the second power supply line 83 has the pair of metal rods 83a. Since the metal rods are not easily deformed, the metal rods 82a are prevented from coming close to each other or coming into contact with each other and the metal rods 83a are prevented from coming close to each other or coming into contact with each other. Thus, discharge is less likely to occur. However, in the case of using a metal rod having no connecting portion for a power supply line, it becomes difficult to attach the power supply line to the terminal 81 on the stage 52 side and the power supply terminal 69 on the DC power supply 68 side since the metal rod is not easily deformed. Therefore, the power supply line is divided into the first power supply line 82 and the second power supply line 83, and the first power supply line 82 and the second power supply line 83 are connected via the connecting unit 84.

Japanese Patent Application Publication No. 2015-226010 discloses that the power is supplied to the attraction electrode from the outer peripheral side of the stage. However, Japanese Patent Application Publication No. 2015-226010 does not disclose the configuration of the power supply mechanism. Therefore, the present embodiment provides the above-described advantageous configuration of the power supply mechanism for supplying power to the attraction electrode in the stage device maintained at an extremely low temperature.

The metal rods 82a of the first power supply line 82 and the metal rods 83a of the second power supply line 83 are preferably made of stainless steel. Although stainless steel has poor electrical conductivity compared to copper, stainless steel can prevent the occurrence of dew condensation due to its low thermal conductivity. Further, stainless steel is advantageous in that it is less likely to be deformed due to its high rigidity.

Second Embodiment

Next, a second embodiment will be described.

Figure 3:
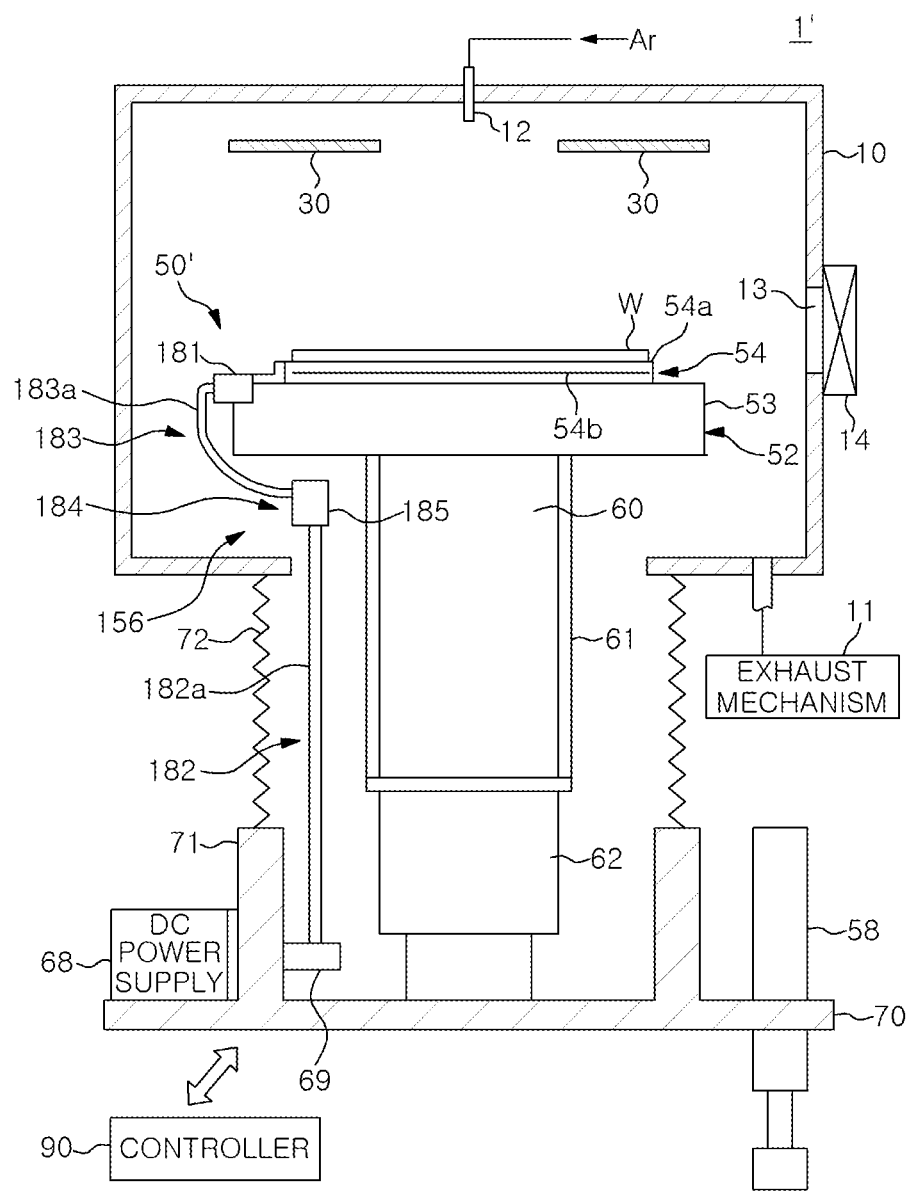
FIG. 3 is a cross-sectional view schematically showing an example of a processing apparatus including a stage device according to a second embodiment.
Figure 4:
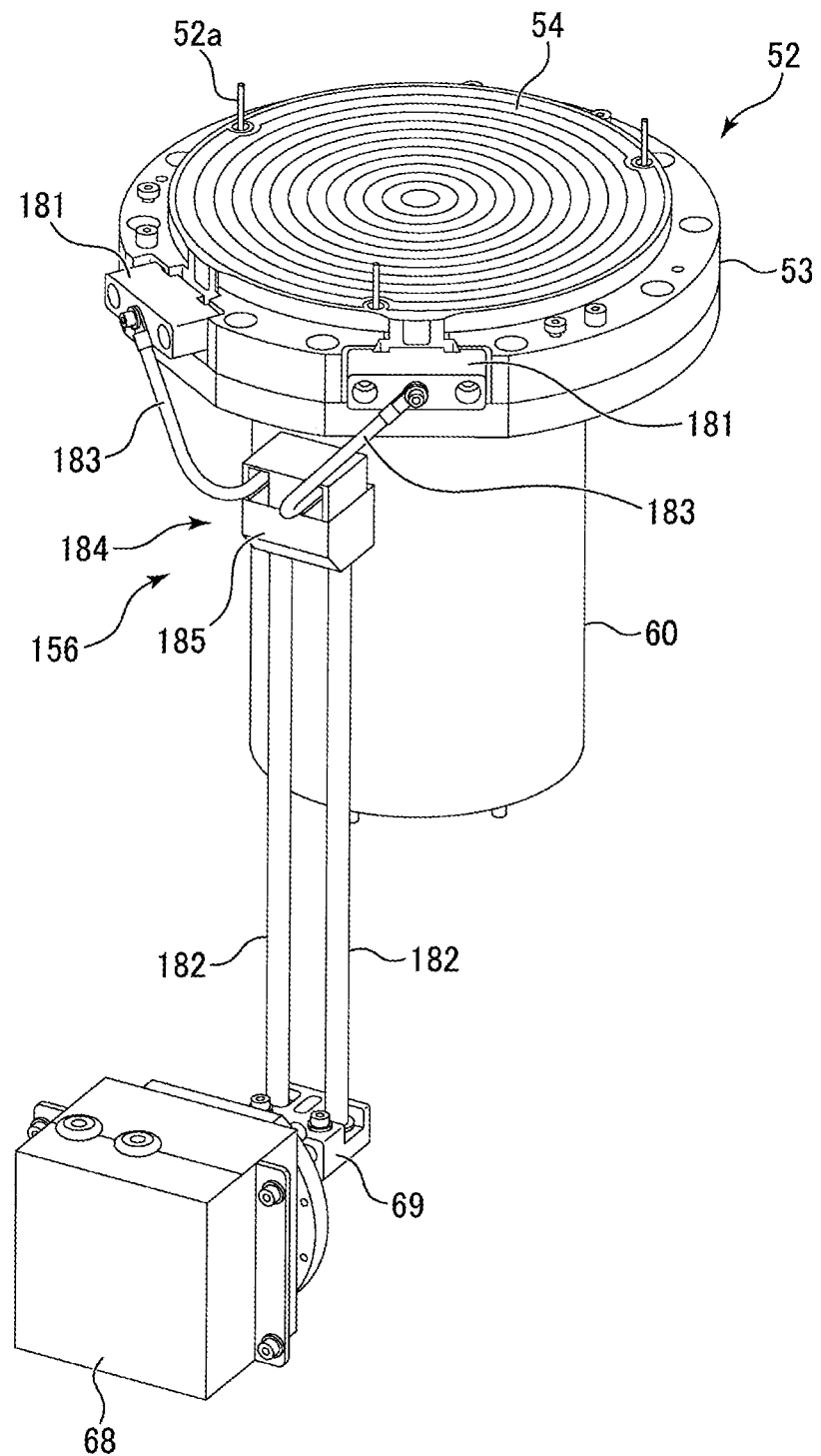
FIG. 4 is a perspective view showing main parts of the stage device according to the second embodiment.

FIG. 3 is a cross-sectional view schematically showing an example of a processing apparatus including a stage device according to the second embodiment. FIG. 4 is a perspective view showing main parts of the stage device according to the second embodiment.

In FIGS. 3 and 4, like reference numerals will be given to like parts and redundant description thereof will be omitted.

A stage device 50' of the present embodiment is different from the stage device 50 of the first embodiment in that the stage device 50' includes a power supply mechanism 156 instead of the power supply mechanism 56. A processing apparatus 1' is different from the processing apparatus 1 in that the processing apparatus 1' includes the stage device 50' instead of the stage device 50.

The power supply mechanism 156 is configured to supply power from the DC power supply 68 to the attraction electrode 54b of the electrostatic chuck 54. Further, the power supply mechanism 156 supplies the power from an outer peripheral side of the stage 52 to the attraction electrode 54b. The power supply mechanism 156 includes a pair of terminals 181, a first supply line 182, a second supply line 183, and a connecting unit 184.

The pair of terminals 181 have the same configuration as the pair of terminals 81 of the stage device 50 and are disposed at an outer peripheral portion of the stage 52.

The first power supply line 182 has a pair of metal rods 182a having one ends respectively connected to the positive side and the negative side of the DC power supply 68. The pair of metal rods 182a extend upward along the side surface of the cooling unit (the chiller 62 and the cold heat transfer body 60) to reach the connecting unit 184. The surface of each of the metal rods 182a is coated with an insulating material. The insulating material may be resin. The pair of metal rods 182a are spaced apart from each other to prevent discharge. Lower ends of the pair of metal rods 182a of the first power supply line 182 are respectively connected to the positive side and the negative side of the power supply terminal 69.

The second power supply line 183 has a pair of metal rods 183a having one ends respectively connected to the pair of terminals 181 and extending toward the connecting unit 184. The surface of each of the metal rods 183a is coated with an insulating material.

The connecting unit 184 has an insulating cover 185 that covers a connecting location of the upper ends of the pair of metal rods 182a of the first power supply line 182 and the other ends of the pair of metal rods 183a of the second power supply line 183. The insulating cover 185 is made of ceramic or resin. It is preferable to use ceramic to suppress generation of gas.

As described in the first embodiment, in the high vacuum processing, generally, discharge is unlikely to occur when there is a sufficient insulation distance between a pair of power supply lines even if the pair of power supply lines is exposed. In order to maintain the high vacuum state, it is advantageous not to provide a cover (insulation coating) that may serve as a gas release source. However, it was actually found that when the high vacuum processing is performed at an extremely low temperature, especially at a temperature of −173° C. (100K) or lower, discharge may occur even if the pair of power supply lines are spaced apart from each other by a sufficient insulating distance. Especially, it was found that discharge is more likely to occur when the flow rate of the supplied gas increases. If the discharge occurs during the supply of power, attraction failure may occur in the electrostatic chuck 54. If the attraction failure occurs, the wafer W is misplaced.

Therefore, in the power supply mechanism 156 of the stage device 50' of the present embodiment, the insulation is enhanced by coating each of the metal rods 182a of the first power supply line 182 and each of the metal rods 183a of the second power supply line 183 with an insulating material and covering the connecting unit 184 with the insulating cover 185. Since the connecting location of the first power supply line 182 and the second power supply line 183 is formed in an angular shape and it is considered that discharge is likely to occur particularly in the connecting location, it is more effective to cover the connecting location with the insulating cover 185. In the present embodiment, the occurrence of discharge can be suppressed by using the power supply mechanism 156 having an enhanced insulating property.

The insulating material made of resin serves as a gas source and is disadvantageous in maintaining a high vacuum state. However, the insulating material made of resin is advantageous in preventing the occurrence of discharge in the power supply mechanism 156 at an extremely low temperature and suppressing the attraction failure in the electrostatic chuck 54.

In the present embodiment, the occurrence of discharge can be suppressed in other manners in addition to the coating of the metal rods 182a of the first power supply line 182 and the metal rods 183a of the second power supply line 183 with an insulating material and the covering of the connecting unit 184 with the insulating cover. For example, in the first embodiment, each metal rod of the second power supply line 83 has a flat plate shape with an angular portion, whereas in the present embodiment, the metal rod of the second power supply line 183 has a round shape without an angular portion. Further, the discharge is less likely to occur by forming the power supply terminal 69 without an angular portion.

Hereinafter, the result of evaluating the effects of the second embodiment will be described.

The discharge of the power supply mechanism in the case of using the stage device of the first embodiment and the stage device of the second embodiment was checked. Here, the pressure in the processing chamber was set to $1 \times 10^{-5}$ Pa; the temperature of the stage was set to 50K; and the DC voltage was supplied from the DC power supply to the attraction electrode of the electrostatic chuck through the power supply mechanism while supplying Ar gas into the processing chamber. At this time, a current hardly flows through the attraction electrode when the electrostatic chuck operates normally. However, the current increases when the discharge of the power supply mechanism occurs. Therefore, whether or not the discharge has occurred was checked by measuring the value of the current flowing through the attraction electrode. As a result, when the flow rate of Ar gas was set to 500 sccm that is the maximum flow rate for performing sputtering film formation at an extremely low temperature of 50K, an increase in the value of the current was observed in the stage device of the first embodiment, and the occurrence of discharge was confirmed. On the other hand, in the stage device of the second embodiment, an increase in the value of the current was not observed under the same conditions, and no occurrence of discharge was confirmed.

Next, in the stage device of the second embodiment, the flow rate of Ar gas was further increased to check an increase in the value of the current flowing through the attraction electrode. As a result, when the Ar gas flow rate was increased up to 1200 sccm, an increase in the value of the current was observed. This result shows that the stage device of the second embodiment can sufficiently prevent the attraction failure of the wafer caused by the occurrence of discharge in the power supply mechanism in normal sputtering film formation.

<Other Applications>

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

For example, in the above-described embodiments, the case where the stage device is applied to the processing apparatus for performing sputtering film formation has been described as an example. However, the present disclosure is not limited thereto as long as the stage is cooled and the substrate is processed at a low temperature.

Further, in the above-described embodiments, as an example of the cooling unit of the stage, the cooling unit that transfers the cold heat of the chiller to the stage through the cold heat transfer body has been described. However, the present disclosure is not limited thereto.

Further, although the semiconductor wafer has been described as an example of the substrate, the substrate is not limited to the semiconductor wafer, and may be other substrates such as a glass substrate used for a flat panel display (FPD) or a ceramic substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A stage device for holding a substrate in a processing chamber maintained in a vacuum state in a processing apparatus for processing a substrate, the stage device comprising:
a stage including a main body made of copper and an electrostatic chuck that is disposed on the main body and has therein an attraction electrode to attract and hold the substrate;
a cooling unit disposed below the stage and configured to cool the stage; and
a power supply mechanism provided at an outer side of the stage and configured to supply power to the attraction electrode from a DC power supply disposed below the stage,
wherein the power supply mechanism includes:
a pair of terminals disposed at an outer peripheral portion of the stage while being spaced apart from each other, the pair of terminals having connecting portions respectively connected to a positive side and a negative side of the attraction electrode;
a first power supply line having a pair of metal rods spaced apart from each other, the pair of metal rods extending toward the stage and having one ends respectively connected to a positive side and a negative side of the DC power supply, wherein the metal rods are made of stainless steel and the metal rods are straight;
a second power supply line having a pair of metal rods spaced apart from each other, the pair of metal rods having one ends respectively connected to the pair of terminals, wherein the metal rods of the second power supply line are made of stainless steel; and
a connecting unit where the other ends of the pair of metal rods of the first power supply line and the other ends of the pair of metal rods of the second power supply line are connected.

2. The stage device of claim 1, wherein the pair of metal rods of the first power supply line extend from the DC power supply toward the stage along the cooling unit.

3. The stage device of claim 2, wherein the cooling unit includes a chiller disposed below the stage and a cold heat transfer body made of copper, the cold heat transfer body being configured to support the stage and transfer cold heat of the chiller to the stage,
wherein the pair of metal rods of the first power supply line extend along the chiller and the cold heat transfer body.

4. The stage device of claim 1, wherein the one ends of the first power supply line are connected to a power supply terminal of the DC power supply.

5. The stage device of claim 1, wherein the connecting unit is disposed directly below the stage.

6. The stage device of claim 1, wherein a surface of each of the pair of metal rods of the first supply line is coated with an insulating material and a surface of each of the pair of metal rods of the second supply line is coated with the insulating material.

7. The stage device of claim 1, wherein the connecting unit has an insulating cover that covers a connecting location of the pair of metal rods of the first power supply line and the pair of metal rods of the second power supply line.

8. The stage device of claim 1, wherein the cooling unit is controlled such that a cooling temperature of the stage becomes −173° C. (100K) or lower.

9. The stage device of claim 1, wherein a processing gas is supplied into the processing chamber while the inside of the processing chamber is maintained at a high vacuum level of $1\times10^{-5}$ Pa or less.

10. A power supply mechanism provided at an outer side of a stage, for supplying power from a DC power supply, that is disposed below a stage cooled by a cooling unit disposed below the stage, to an attraction electrode of an electrostatic chuck configured to attract and hold a substrate placed on the stage in a processing chamber maintained in a vacuum state in a processing aparats for processing the substrate, the power supply mechanism comprising:
a pair of terminals disposed at an outer peripheral portion of the stage while being spaced apart from each other, the pair of terminals having connecting portions respectively connected to a positive side and a negative side of the attraction electrode;
a first power supply line having a pair of metal rods spaced apart from each other, the pair of metal rods extending toward the stage and having one ends respectively connected to a positive side and a negative side of the DC power supply, wherein the metal rods are made of stainless steel and the metal rods are straight;
a second power supply line having a pair of metal rods spaced apart from each other, the pair of metal rods having one ends respectively connected to the pair of terminals, wherein the metal rods of the second power supply line are made of stainless steel; and
a connecting unit where the other ends of the pair of metal rods of the first power supply line and the other ends of the pair of metal rods of the second power supply line are connected.

11. The power supply mechanism of claim 10, wherein the pair of metal rods of the first power supply line extend from the DC power supply toward the stage along the cooling unit.

12. The power supply mechanism of claim 10, wherein the one ends of the first power supply line are connected to a power supply terminal of the DC power supply.

13. The power supply mechanism of claim 10, wherein the connecting unit is disposed directly below the stage.

14. The power supply mechanism of claim 10, wherein a surface of each of the pair of metal rods of the first supply line is coated with an insulating material and a surface of each of the pair of metal rods of the second supply line is coated with the insulating material.

15. The power supply mechanism of claim 10, wherein the connecting unit has an insulating cover that covers a connecting location of the pair of metal rods of the first power supply line and the pair of metal rods of the second power supply line.

16. The power supply mechanism of claim 10, wherein the cooling unit is controlled such that a cooling temperature of the stage becomes −173° C. (100K) or lower.

17. A processing apparatus for processing a substrate comprising:
a processing chamber accommodating the substrate;

the stage device described in claim 1, configured to hold the substrate in the processing chamber; and an exhaust mechanism configured to maintain the inside of the processing chamber in a vacuum state.

18. The processing apparatus of claim 17, wherein a target for sputtering film formation is disposed above the stage in the processing chamber.

19. The processing apparatus of claim 18, wherein the target is made of a material to form a magnetic body used for a tunneling magneto-resistance element.

* * * * *